United States Patent [19]

Barlow

[11] Patent Number: 4,864,079
[45] Date of Patent: Sep. 5, 1989

[54] ELECTRICAL COMPONENTS AND ASSEMBLIES

[75] Inventor: Alan Barlow, Cheltenham, England

[73] Assignee: Smiths Industries Public Limited Company, London, England

[21] Appl. No.: 166,128

[22] Filed: Mar. 9, 1988

[30] Foreign Application Priority Data

Mar. 19, 1987 [GB] United Kingdom ................ 8706610

[51] Int. Cl.$^4$ ............................................ H05K 03/32
[52] U.S. Cl. .................................. 174/52.1; 174/52.4; 357/70; 361/405; 361/408
[58] Field of Search ....................... 361/404, 405, 408; 174/52.4, 52.1; 357/70

[56] References Cited

U.S. PATENT DOCUMENTS

| | | | |
|---|---|---|---|
| 3,150,288 | 9/1964 | Flanders et al. | 361/411 X |
| 3,368,114 | 2/1968 | Campbell et al. | 357/70 X |
| 3,745,513 | 7/1973 | Gross | 361/408 X |
| 4,673,967 | 6/1987 | Hingorany | 174/52.4 X |
| 4,704,320 | 11/1987 | Mizunoya et al. | 174/68.5 X |
| 4,728,751 | 3/1988 | Canestaro et al. | 361/408 XE |
| 4,739,125 | 4/1988 | Watanabe et al. | 361/405 X |
| 4,751,199 | 6/1988 | Phy | 357/70 X |
| 4,761,518 | 8/1988 | Butt et al. | 174/52.4 |
| 4,764,848 | 8/1988 | Simpson | 174/52.4 X |

FOREIGN PATENT DOCUMENTS 2169448 7/1986 United Kingdom .

OTHER PUBLICATIONS

Improved Lead Frame Structure for Surface Mounting Package, IBM Tech. Disc. Bull., vol. 29, #6, Nov. 1986, pp. 2562-2563.

Primary Examiner—R. R. Kucia
Attorney, Agent, or Firm—Pollock, VandeSande and Priddy

[57] ABSTRACT

A surface-mounted electrical component has rectangular section leads that project outwardly from the edges of the component body. The leads are bent down towards the surface of the substrate and are twisted through 90 degrees about their length to make the leads compliant in a direction transverse of their width where they emerge from the body. The lower end of the leads are straight and untwisted, making a vertical butt solder joint with contact pads on the substrate. The twisted region of the leads are treated, such as by nickel plating, to render them non-wetted by solder. Because of the greater spacing possible between the contact pads, conductive tracks can extend through gaps between the contact pads beneath the body of the component.

8 Claims, 3 Drawing Sheets

ELECTRICAL COMPONENTS AND ASSEMBLIES

BACKGROUND OF THE INVENTION

This invention relates to electrical components and assemblies and to their manufacture.

The invention is more particularly concerned with leaded electrical components for use in surface mounted assemblies.

Surface mounted components are rapidly taking the place of dual-in-line components for many applications because of the more compact arrangements and the ease of automated mounting that is possible with such components.

Surface mounted components can be either leadless or leaded. The leadless components have contact pads formed around their surface which are directly joined to contact pads on a board or substrate. These leadless components give the most compact configuration, but suffer from the disadvantage that there is little compliance in the mounting of the component with the substrate. Vibration and differential thermal expansion of the component relative to the board can cause stress in the solder joint, with possible damage or increase in joint resistance. Thermal expansion is especially a problem with high-power components.

Leaded components reduce this problem to a certain extent. These leaded components generally have a flat lead of rectangular section which is bent down towards the contact pad. In one form, the leads are bent to form a loop of 'J' shape where they abut the contact pads. Alternatively, the leads may be bent to form a flat foot parallel to the contact pad. The length of the lead allows flexing in the plane including the bend in the lead, enabling relative movement to occur between the component and the substrate in a vertical direction and in a horizontal direction at right angles to the edge of the component from which the lead extends. The width of the lead, however, means that it is relatively stiff across its width so that there is very little compliance in the horizontal direction laterally of the lead, that is, parallel to the edge of the component.

A further disadvantage of the previous arrangements arises because the lead is bent to form a loop or flat foot, so that a side of the lead contacts the contact pad on the substrate. This gives a large area of contact, but can cause spreading of the solder paste used to make the joint, beyond the contact pad, when the lead is pushed down onto the contact pad. This can result in the bridging of adjacent contact pads. It will also be seen that, because the width of the contact pads must be at least equal to the width of the leads, the separation between adjacent contact pads is dictated by the spacing between the leads on the component and can be very narrow. This difficulty is increased because the width of leaded components varies from manufacturer to manufacturer and because the width of the contact pad must, therefore, be large enough to accommodate the widest lead.

BRIEF SUMMARY OF THE INVENTION

It is an object of the present invention to provide an electrical component and assembly by which at least some of these disadvantages can be alleviated.

According to one aspect of the present invention there is provided an electrical component for mounting on a substrate, the component having a body and a plurality of leads of rectangular section extending outwardly of the body and having a portion that extends downwardly towards the substrate, the leads being twisted about their length such as to introduce compliance in the leads in a direction transverse of the width of the leads where they emerge from the body.

The leads are preferably twisted in that portion that extends downwardly towards the substrate and are preferably twisted through an angle of substantially 90 degrees. The lower end of the leads adjacent the substrate is preferably untwisted and straight, being arranged to extend vertically of the substrate.

The leads may be treated to render them non wetted by solder in the twisted region such that solder is confined to the lower end of the leads adjacent the substrate. The leads may be treated by plating with nickel or coating with an oxide.

The leads may project below the lower surface of the body so that the body is raised above the upper surface of the subtrate.

According to another aspect of the present invention there is provided a method of forming leads of an electrical component for surface mounting on a substrate comprising the steps of providing a component with a body having a plurality of leads of rectangular section extending outwardly of the body, and twisting the leads about their length to form a twisted region that provides compliance in the leads in a direction transvesre to the width of the leads where they emerge from the body.

The twisted regions are preferably bent down towards the substrate subsequently to the twisting step. The leads may be treated to render them non wetted by solder in the twisted regions.

According to a further aspect of the present invention there is provided an electrical component having leads formed by the above other aspect of the present invention.

According to yet another aspect of the present invention there is provided a component assembly including an electrical component according to the above one or further aspects of the present invention and a substrate on which the component is mounted, the substrate having electrically conductive regions on a surface thereof to which the leads are soldered.

The conductive regions may be located on a surface of the substrate facing the component, the leads butting vertically onto respective conductive regions on the substrate and being soldered thereto. The surface of the substrate may have conductive tracks thereon that extend through gaps between the conductive regions and extend beneath the body of the component.

A surface-mounted leaded component in an assembly on a substrate, and a method of forming the leads on the component, in accordance with the present invention, will now be described, by way of example, with reference to accompanying drawings.

DESCRIPTION OF THE PREFERRED EMBODIMENT

Figure 1:
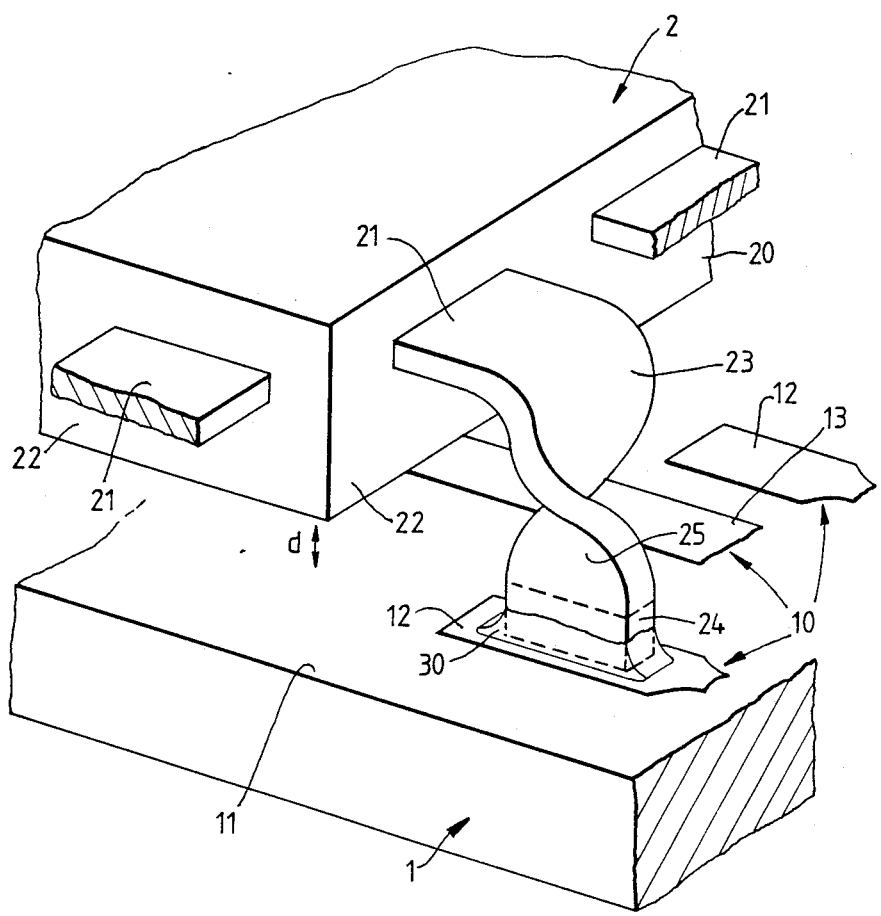
FIG. 1 is a perspective view of the assembly.

With reference to FIG. 1, the electrical component assembly consists of a board or substrate 1 on which is mounted one or more electrical components 2.

The substrate 1 is of a conventional material such as FR4 epoxy glass, or a copper/invar/copper laminate insulated by polyimide, and has a pattern 10 of electrically-conducting regions on its upper surface 11 which include several contact pads 12 to which the electrical component 2 is connected.

The electrical component 2 has an insulative body 20, enclosing an electrical device or circuit (not shown), and several copper alloys leads 21 which project outwardly from the edges 22 of the component body. The leads 21 are of rectangular section with their wider side arranged horizontally where they emerge from the body 20, the material and dimensions of the leads being such that they are relatively stiff. The leads 21 extend horizontally where they emerge from the body 20 for a short distance and are then bent downwards to form a vertical section 23 which extends to the substrate 1. In the vertical section 23, each lead 21 is also twisted about its length through 90 degrees, so that the lower end 24 of the vertical section is oriented with its width extending in an direction at right angles to the edge 22 of the component body. The twist in the vertical section 23 is confined to its upper part so that the lower end 24 is straight and untwisted. The lower end 24 butts onto the respective contact pad 12, contact with the pad thereby being over the cross sectional area of the end of the lead 21.

The entire length of the leads 21, except for the lower end 24, is treated to form a region 25 that is non wetted by solder. This could be achieved, for example, by plating with nickel or coating with an oxide. A solder joint, indicated by the numeral 30, is formed between each contact pad 12 and the respective lead 21, such as by conventional vapour phase reflow soldering or jet wave soldering techniques. The non wetting treatment confines flow of solder to the lower, untreated end 24 of the lead 21 and prevents it moving onto the twisted part of the lead. The length of the vertical portion 23 of the lead is such that it projects below the lower surface of the component body 20 and supports it spaced above the upper surface 11 of the substrate 1 by a distance 'd' of about 0.25 mm. This distance is sufficient to enable cleaning between the substrate and component, if desired.

The twist in the lead is formed in the manner described below.

Figure 2:
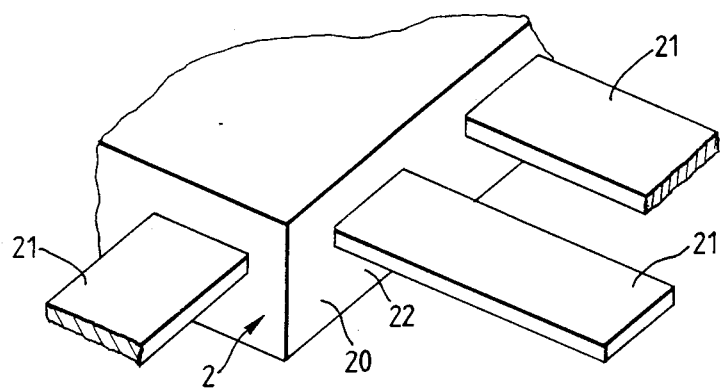
FIGS. 2 to 5 are perspective views of the component showing steps in the manufacture.

The component 2 initially has several copper alloys leads 21 extending horizontally outwardly from the body in a straight line, as shown in Figure 2.

Figure 3:
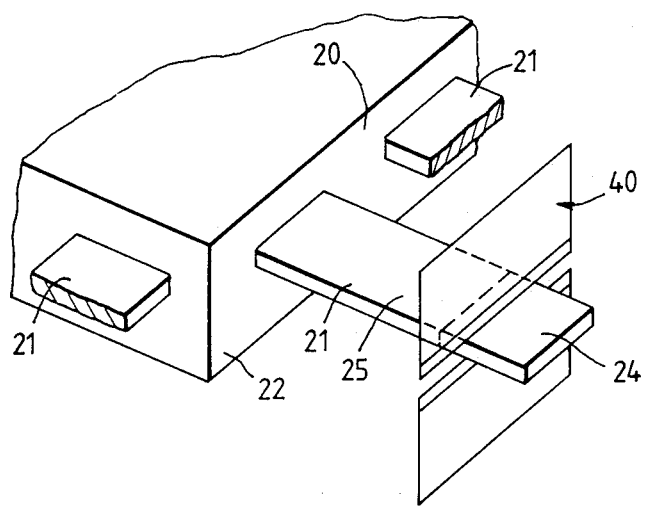

The inner ends of the leads 21 are treated to form the non-wetting regions 25, such as by coating with nickel or an oxide, while leaving what will become the lower end 24 untreated. The leads are then cropped by a cutter 40 to the desired length as shown in FIG. 3.

Figure 4:
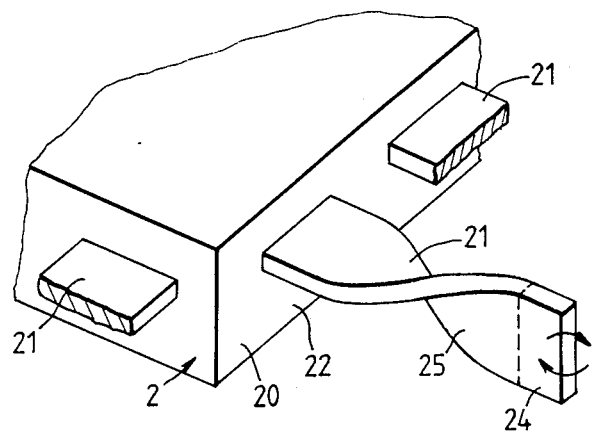

The leads 21 are subsequently twisted, as shown in FIG. 4, through 90 degrees about their length in a central region so that the inner end, closer to the component body 20, and the outer end 24 remain flat and untwisted, although now oriented at right angles to one another. The twisting is achieved by gripping the leads 21 close to the body 20 so as to prevent twisting in this region. A head (not shown) then grips the outer end of the leads 21 which is then rotated, such as by a rack and pinion mechanism as the component advances, through an angle greater than 90 degrees to allow for spring back of the lead caused by its resilience. The close separation between leads may make it difficult to twist them all at the same time. Instead, a mechanism may be used which grips only alternate leads, the component then being stopped by a distance equivalent to one lead and the process repeated. Alternatively, the first, fourth, seventh and so on leads may be gripped and the component stepped twice to twist the other leads.

Figure 5:
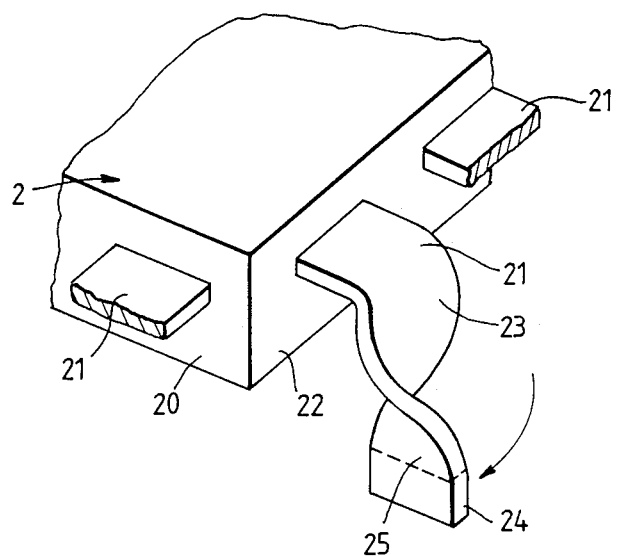

The next step is shown in FIG. 5 and involves bending the leads 21 downwardly at 90 degrees at the inner end of the twisted region, so that the twisted regions extend vertically downwards and the component is completed.

With the twist in the leads 21, they have compliance in three planes, the twist itself enabling displacement of the component 2 relative to the substrate 1 in a direction parallel to the edge 22 of the component. Where the twist is through 90 degrees, the width of the lower end extends along a line at right angles to the edge 22 of the component 2 and thereby enables the contact pad 12 on the substrate 1 to be oriented in the same direction. This thereby enables a greater separation to be achieved between adjacent contact pads 12 along any one edge of the component. The increased separation can be sufficient to enable conductive tracks 13 to extend through the gaps between contact pads. This can greatly facilitate interconnection on some subtrates by enabling tracks to extend underneath components instead of around them.

The length of the contact pads 12 can be sufficient to receive the widest of leads without reducing the separation between adjacent contact pads. In this way, the risk of solder flowing between adjacent contact pads can be reduced.

The risk of solder flow between contact pads is further reduced by the vertical butt joint of the leads with the contact pads. This also facilitates visual inspection of the solder joint.

Although the invention is most advantageously applied to butt joints, it is not limited to such joints. For example, where space permits, such as at the corners of components, the lead could be bent to form a loop or flat foot where it contacts the substrate. Alternatively, the lead could extend through an aperture in the substrate and be soldered on the opposite surface of the substrate, that is, the surface facing away from the component.

It will be seen that the twist could be greater or less than 90 degrees, providing it is such as to give compliance to the lead in a direction transverse to the width of the lead where it emerges from the component. The twist could be made in the horizontal portion of the lead rather than the vertical portion.

What is claimed is:

1. An electrical component for mounting on a substrate, said substrate comprising a generally rectangular body and a plurality of leads emerging from said body, said leads being of rectangular section and extending outwardly from at least one edge of the body in spaced relation to one another, each of said leads having a portion that extends downwardly towards the substrate, and said leads being twisted about their length such as thereby to introduce compliance in the leads in a direction transverse of the width of the leads where they emerge from the said body, said leads being so twisted that the spacing between adjacent leads is greater adjacent the substrate than the spacing between said adjacent leads where they emerge from the body.

2. An electrical component according to claim 1, wherein the said leads are twisted in that portion of each lead that extends downwardly towards the substrate.

3. An electrical component according to claim 1, where each of said leads is twisted through an angle of substantially 90 degrees.

4. An electrical component according to claim 1, wherein the lower end of each lead adjacent the substrate is untwisted.

5. An electrical component according to claim 1, wherein the lower end of each lead adjacent the substrate is straight and the lower end extends vertically of the substrate.

6. An electrical component according to claim 1, wherein the leads are treated to render them non wetted by solder in the twisted region thereof such that solder is confined to the lower ends of the leads adjacent to the substrate.

7. An electrical component according to claim 1, wherein the said leads project below the lower surface of the body so that the body is thereby raised above an upper surface of the substrate.

8. An electrical component for mounting on a substrate, said component comprising a generally rectangular body and a plurality of leads emerging from said body, said leads being of rectangular section and extending outwardly from at least one edge of the body in spaced relation to one another, each of said leads having a portion that extends downwardly towards the substrate, said portions being twisted through an angle of substantially 90 degrees about their length such as thereby to introduce compliance in the leads in a direction transverse of the width of the leads where they emerge from the said body and to cause the spacing between the lower ends of adjacent leads to be greater adjacent the substrate than the spacing between the upper ends of said adjacent leads where they emerge from said body, the lower ends of the leads adjacent the substrate being straight and extending vertically of the substrate, and the leads being treated to render them non wetted by solder in the twisted region of each lead.

* * * * *